US010847238B2

(12) United States Patent
Li et al.

(10) Patent No.: US 10,847,238 B2
(45) Date of Patent: Nov. 24, 2020

(54) ANALOG, NON-VOLATILE, CONTENT ADDRESSABLE MEMORY

(71) Applicant: HEWLETT PACKARD ENTERPRISE DEVELOPMENT LP, Houston, TX (US)

(72) Inventors: Can Li, Palo Alto, CA (US); Catherine Graves, Palo Alto, CA (US); John Paul Strachan, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/274,379

(22) Filed: Feb. 13, 2019

(65) Prior Publication Data
US 2020/0258587 A1 Aug. 13, 2020

(51) Int. Cl.
*G11C 27/00* (2006.01)
*G11C 15/04* (2006.01)
*G11C 11/16* (2006.01)
*G11C 13/00* (2006.01)

(52) U.S. Cl.
CPC ............ *G11C 27/005* (2013.01); *G11C 11/16* (2013.01); *G11C 13/0004* (2013.01); *G11C 13/0007* (2013.01); *G11C 15/046* (2013.01)

(58) Field of Classification Search
CPC ... G11C 27/005; G11C 11/16; G11C 13/0004; G11C 13/0007; G11C 15/046
See application file for complete search history.

(56) References Cited

U.S. PATENT DOCUMENTS

| 6,442,090 | B1 * | 8/2002 | Ahmed | G11C 7/062 365/207 |
| 6,985,372 | B1 * | 1/2006 | Blyth | G11C 15/046 365/189.07 |
| 7,554,844 | B2 | 6/2009 | Werner et al. | |
| 8,654,555 | B2 * | 2/2014 | Shin | H04N 5/378 365/49.1 |
| 2014/0092664 | A1 | 4/2014 | Bourianoff et al. | |
| 2020/0075099 | A1 * | 3/2020 | Choi | G11C 15/02 |

OTHER PUBLICATIONS

Chiao-Ying Huang, "Ternary Content-addressable Memory Circuits," 2012, pp. 1-7, IEEE.
Miles Rusch and Jan M. Rabaey, ED., "The Design of an Analog Associative Memory Circuit for Applications in High-dimensional Computing," May 18, 2018, pp. 1-28, Technical Report No. UCB/EECS-2018-72, University of California at Berkeley, Berkeley, CA, USA.
Tomochika Harada et al., "A Content-addressable Memory Using "Switched Diffusion Analog Memory with Feedback Circuit"," Abstract, Dec. 2000, 1-page (online), Retrieved from the Internet on Feb. 13, 2019 at URL: <researchgate.net/publication/227035660_A_Content-Addressable_Memory_Using_Switched_Diffusion_Analog_Memory_with_Feedback_Circuit>.

* cited by examiner

*Primary Examiner* — Pho M Luu
(74) *Attorney, Agent, or Firm* — Nolte Intellectual Property Law Group

(57) ABSTRACT

An analog content addressable memory cell includes a high side and a low side. The high side encodes a high bound on a range of values and includes a first voltage divider formed of a first programmable resistor and a first electronically controlled variable resistor. The low side encodes a low bound on the range of values and includes a second voltage divider formed of a second programmable resistor and a second electronically controlled variable resistor.

23 Claims, 6 Drawing Sheets

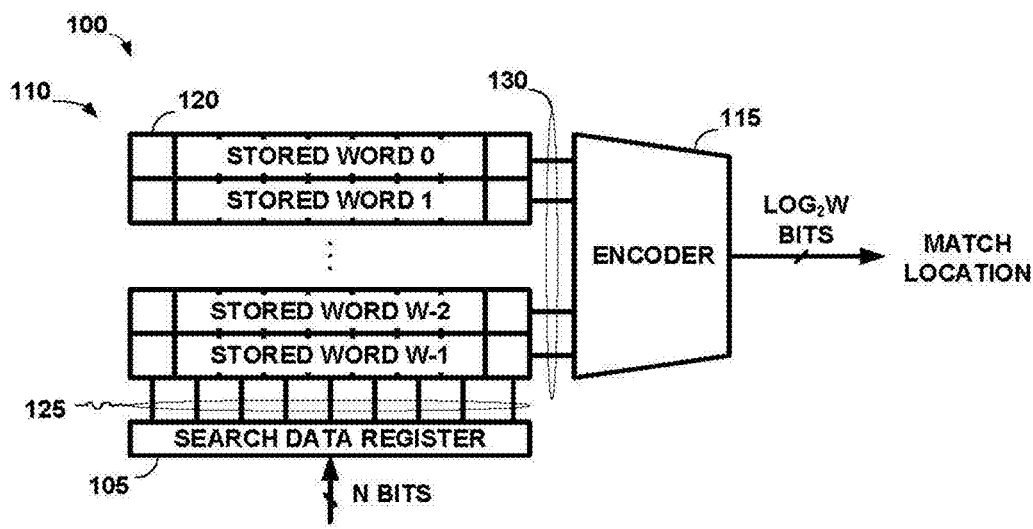
FIG. 1
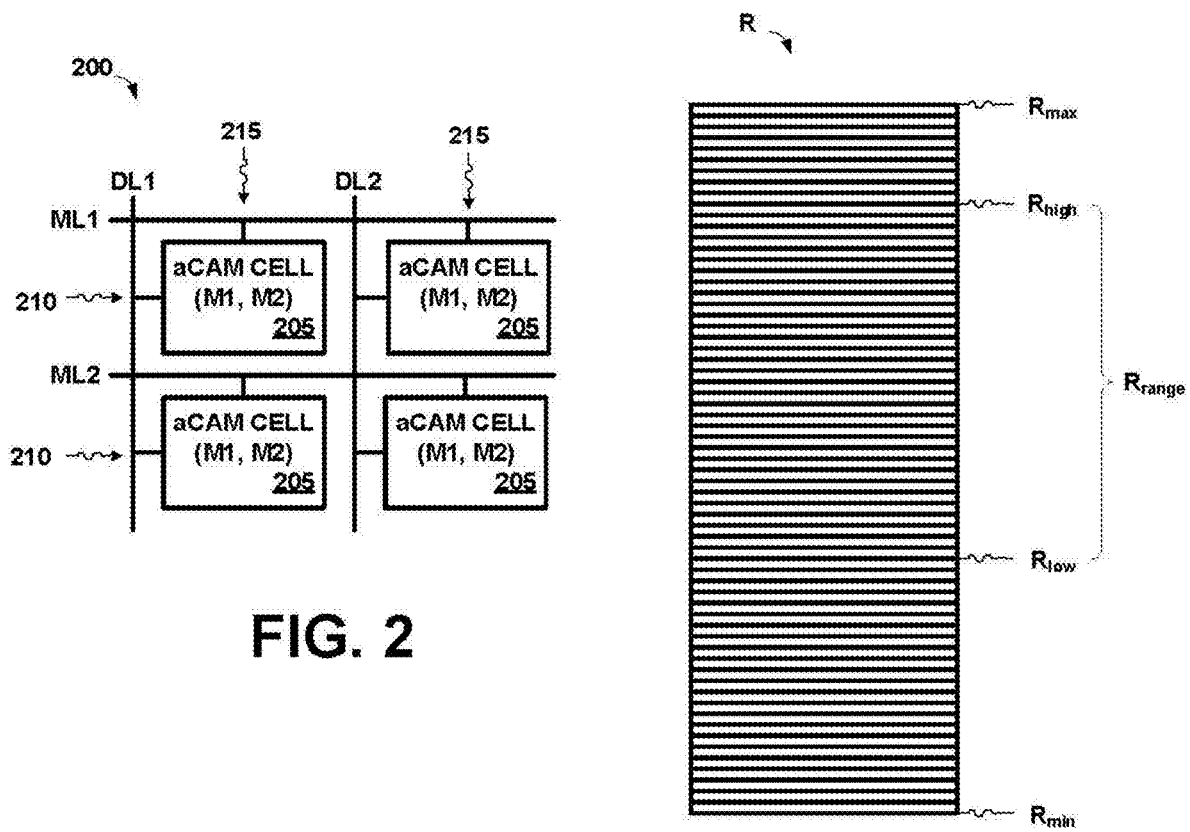
FIG. 2
FIG. 3

ANALOG, NON-VOLATILE, CONTENT ADDRESSABLE MEMORY

BACKGROUND

Content addressable memory ("CAM") is a type of computing memory in which the stored data is not accessed by its location but rather by its content. A word, or "tag", is input to the CAM, the CAM searches for the tag in its contents and, when found, the CAM returns the address of the location where the found contents reside. CAMs are powerful, efficient, and fast. However, CAMs are also relatively large, consume a lot of power, and are relatively expensive. These drawbacks limit their applicability to select applications in which their power, efficiency, and speed are sufficiently desirable to outweigh their size, cost, and power consumption.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

FIG. 1 conceptually depicts an analog content addressable memory ("analog CAM") in accordance with one or more examples of the subject matter claimed below.

FIG. 2 illustrates selected portions of an analog cell array of an analog CAM such as the analog CAM in FIG. 1 in one particular example.

FIG. 3 conceptually illustrates a resistance differential that may be used to set the stored analog value of the analog CAM cells in FIG. 2 in some examples.

Figure 4:
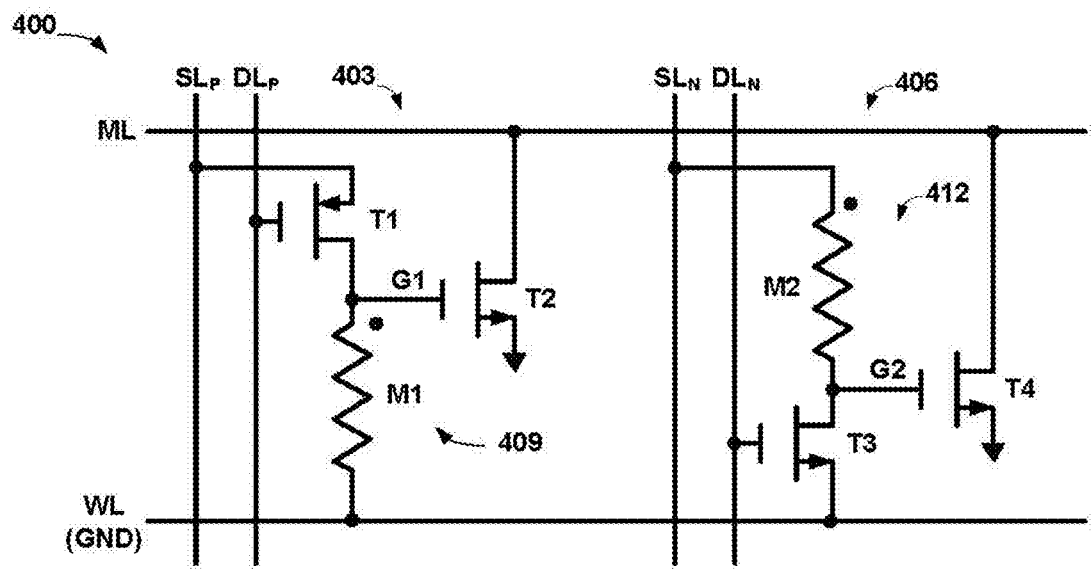
FIG. 4 depicts an analog CAM cell circuit that may be used to Implement the analog CAM cells of FIG. 2 in some examples where the high and low resistance thresholds described in FIG. 3 and encoded by the resistance values of memristors M1 and M2.

While examples described herein are susceptible to various modifications and alternative forms, the drawings illustrate specific examples herein described in detail by way of example. It should be understood, however, that the description herein of specific examples is not intended to be limiting to the particular forms disclosed, but on the contrary, the intention is to cover all modifications, equivalents, and alternatives falling within the spirit and scope of the examples described herein and the appended claims.

DETAILED DESCRIPTION

Illustrative examples of the subject matter claimed below will now be disclosed. In the interest of clarity, not all features of an actual implementation are described in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Content addressable memory ("CAM") is a hardware that compares input patterns against its stored data. The memory that stores the data in the CAM also performs the search operation at the same location, eliminating the expensive data transfer between different units in conventional hardware. During the search, all the memory cells are operating in parallel, which leads to massive throughput with applications in real-time network traffic monitoring, access control lists ("ACL"), associative memories, etc.

CAMs can be implemented in technologies that permit the CAM to hold its contents even when power is lost or otherwise removed. Thus, a CAM's data "persists" and can act as what is known as a "non-volatile memory". These technologies include, for instance, resistive switching memory (i.e. memristor), phase change memory, magnetoresistive memory, ferroelectric memory, some other resistive random access memory device, or combinations of those technologies.

CAMs can be categorized as "binary" or "ternary". A binary CAM ("BCAM") operates on an input pattern containing binary bits of "0" and "1". A ternary CAM ("TCAM") operates on an input pattern (and stores data) containing not only binary bits of "0" and "1", but also an "X" value. An "X" is sometimes referred to as a "don't care" or a "wildcard". In a search on the input pattern in a TCAM, an "X" will return a match on either a "0" bit or a "1". Thus, a search on the input pattern "10X1" will return a match for both "1001" and "1011". Note that both BCAMs and TCAMS use and operate on binary values of "0" and "1". CAMs are digital in that the data are stored in the CAM as binary values in a memory (e.g., SRAM, memristor, etc.) and the input patterns are represented by binarized logic '0's and '1's. Each memory cell in the CAM processes one value at a time (either 0/1 or 0/1/X), which limits the memory density and the power efficiency.

The present disclosure provides an analog CAM ("aCAM") circuit that searches multilevel voltages and stores analog values in a nonvolatile memory (e.g., memristor). One analog cell can implement a function that is equivalent to multiple digital CAM cells, leading to significant advantages in area and power saving in implementing certain CAM-based functions. The aCAM circuit can be driven with standard multi-level digital values, or directly with analog signals, giving additional potential for increased functionality while removing the need for expensive analog-digital conversion. More particularly, an aCAM cell outputs a match when the analog input voltage matches a certain range that is defined by the aCAM cell.

More particularly, an aCAM in accordance with the present disclosure can match all values between a "high value" and a "low value", or within a range, where the range includes non-binary values. These high and low values are set by programming memristors, and so are referred to as "$R_{high}$" and "$R_{low}$" herein. $R_{high}$ and $R_{low}$ set bounds of the range of values that may be stored in the cell such that the cell may store analog values. A memory cell in an aCAM may store any value between the value defined by $R_{high}$ and the value defined by $R_{low}$. If $R_{high}=R_{max}$, where $R_{max}$ is the maximum resistance of a memristor, and $R_{low}=R_{min}$, where $R_{min}$ is the minimum resistance of a memristor, then the stored value is an "X", as in a Ternary CAM. The number of equivalent digital cells or bits that can be stored in an analog CAM cell depends on the number of states the programmable resistor can be programmed to. To be able to encode the equivalent of n bits (i.e., n binary CAM/TCAM cells), the programmable resistor has $2^n+1$ states.

Thus, a memristor-based aCAM can search analog voltages and stores analog values as the value(s) which fall in between $R_{low}$ and $R_{high}$ which are set by the multilevel resistance of the memristors. (A memristor-based aCAM may also search and store digital values.) One example of an aCAM includes a plurality of cells arranged in rows and columns. Each cell performs two analog comparisons: 'greater than' and 'less than' to the searched data line voltage at the same time, with significantly reduced processing time and energy consumption comparing to its digital counterpart. The aCAM can be driven with standard multi-level digital values or directly with analog signals in various examples. This provides additional potential for increased functionality when removing the need for expensive analog-digital conversion. The significant power saving of the proposed memristor aCAM enables the application of CAMs to more generalized computation and other novel application scenarios.

Structurally, in the examples disclosed herein, each memory cell of the aCAM disclosed herein includes a "high side" that sets the high value and a "low side" that sets the low value. Each side of the cell includes a memristor and a pair of transistors in some examples. The memristor and one of the transistors create a voltage divider and the memristor is programmed to define either $R_{high}$ or $R_{low}$ and, hence, the high value or the low value. The second transistor provide a threshold function to determine from the voltage divider whether the searched data (in the case of the high side) is below the high threshold or (in the case of the low side), is below the low threshold. If there is a match, then a match is indicated on a match line in that neither transistor activates to discharge or pull down the match line. An aCAM includes an array of such cells, a search data register into which the input pattern is loaded, and an encoder that produces a match location from the match lines.

Note, however, that the structures shown herein by which the aCAM cells may be implemented are but illustrative means by which the aCAM cells may be implemented. Those skilled in the art having the benefit of this disclosure may realize other, alternative structures by which the disclosed functions of the aCAM cells may be performed. Accordingly, the subject matter claimed below includes not only those means disclosed herein, but also equivalent structures performing the disclosed functions.

More particularly, in some examples, an analog content addressable memory cell includes a high side and a low side. The high side encodes a high bound on a range of values and includes a first voltage divider formed by a first programmable resistor and a first electronically controlled variable resistor. The low side encodes a low bound on the range of values and includes a second voltage divider formed by a second programmable resistor and a second electronically controlled variable resistor.

In other examples, an analog content addressable memory includes a plurality of inputs by which an input pattern may be loaded in use; and an analog memory cell array. Each cell of the analog memory cell array indicates whether a value of the analog input pattern is matched by a range of values contained in the cell, the range of values including non-binary values.

In other examples, a method for storing data in a content addressable memory, includes indicating whether a searched value in an input pattern matches a high value defining a range of values in a cell of an analog memory cell array of the content addressable memory, the range of values including non-binary values; and indicating whether the searched value matches a low value defining the range of values in the cell.

In still other examples, an analog content addressable memory cell, includes means for defining a high value of a range of values, the range of values including non-binary values and indicating whether a searched value matches the high value; and means for defining a low value of the range of values and indicating whether the searched value matches the low value. The means for defining the high value may include a high side encoding a high bound on the range of values and including a voltage divider formed by a programmable resistor and an electronically controlled variable resistor. The means for defining the low value may include a low side encoding a low bound on the range of values and including voltage divider formed by a programmable resistor and a second electronically controlled variable resistor.

Figure 13:
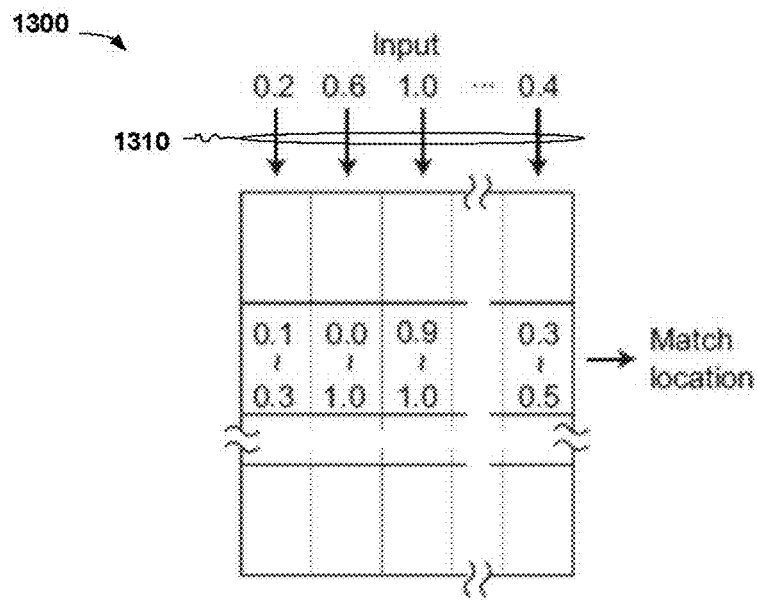
FIG. 13 depicts another example of an analog CAM in accordance with some examples is shown where the searched data lines are analog.

Turning now to the drawings, the aCAM disclosed herein may be used in digital applications to perform traditional TCAM functions and operations as well as in analog applications. FIG. 1, discussed further below, illustrates one particular example of a digital application of the aCAM. FIG. 13 illustrates one particular example of an analog application. The aCAM cell circuits of FIG. 4-FIG. 6 may be used in either digital applications such as FIG. 1 or in analog applications such as FIG. 13.

FIG. 1 conceptually depicts an analog content addressable memory ("aCAM") 100 in accordance with one or more examples of the subject matter claimed below. The aCAM 100 is, in the example of FIG. 1, used in a digital application in which input search patterns and the values stored in the aCAM 100 are digital. An analog example is discussed below relative to FIG. 13.

The aCAM 100 includes a search data register 105, an analog memory cell array 110, and an encoder 115. The analog cell array 110 stores W "stored words" 0 through W−1. Each stored word is a pattern of values, at least some of which may be analog values as described below. The search data register 105, in use, may be loaded with an analog or binary input pattern that can be searched for among the contents of analog cell array 110. The example of FIG. 1 operates on a binary input pattern as indicated by the 'n bits' going to the data line register. An example operating on an analog search pattern is discussed further below. Thus, instead of needing to store two bits of data in two columns as is the case for a digital CAM, one column of the aCAM cells can encode four analog values.

The analog cell array 110 includes a plurality of analog cells 120 (only one indicated) arranged in rows and columns as shown in FIG. 2 and discussed further below. During a search, the analog input pattern loaded into the search data register 105 is communicated to the analog cell array 110 over a plurality of search lines 125. Some examples may use data lines in addition to or in lieu of search lines. Each cell 120 then indicates whether a value of the analog input pattern is matched by a range of values contained in the cell 120, the range of values including non-binary values.

The indications of whether the cells contain matches are communicated to the encoder 115 over a plurality of match lines 130. Note that a match is found if the searched word (or pattern) matches the stored word within a single row. The match lines do not output the matches of individual cells, but whether the stored row word matches the searched data (row). More particularly, that match lines 130 are pre-charged high along rows, data is searched on search lines 125 (or data lines) along columns, and if a mismatch between searched and stored content occurs, the 130 discharges and goes low. If a match occurs, the match line 130 stays high.

The encoder 115 is a priority encoder that returns a match location with the analog cell array 110. Note that the encoder 115 may be omitted in some examples, particularly in examples in which multiple match locations are identified and desired. For instance, because the "don't care" values may be included in the input pattern, multiple matches among the W stored words may be found. Some examples might wish to identify more than one, or even all, match locations and these examples would omit the encoder 115.

FIG. 2 illustrates selected portions of an analog cell array 200 of an aCAM such as the aCAM 100 in FIG. 1 in one particular example. The aCAM cells 205 are arranged in rows 210 and columns 215 and are each individually searchable over the data lines DL1, DL2. Whether a match is found from data on DL1 and DL2 and the data stored in the rows by each aCAM cell's M1 and M2 programmed values is indicated over the match lines ML1, ML2. As those in the art having the benefit of this disclosure will appreciate, an analog cell array 200 will typically be larger than a 2×2 array. The precise size will be implementation specific. The 2×2 portion is shown for illustrative purposes and is not limiting.

Each aCAM cell 205 includes two memristors M1, M2 (not separately shown) that are used to define the range of values stored in the respective aCAM cell 205. FIG. 3 conceptually illustrates a resistance differential that may be used to set the stored analog value or range of the aCAM cells 205 in FIG. 2 in some examples. The total range of resistance R that may be implemented by both memristors M1, M2 is defined by a maximum resistance $R_{max}$ and a minimum resistance $R_{min}$. A range of resistance $R_{range}$ is defined by $R_{high}$ and $R_{low}$. $R_{high}$ is determined by programming a value in M1 and $R_{low}$ is determined by programming a value in M2. When an analog value is stored, the analog number is encoded in the cell via two resistance thresholds, a high and a low resistance threshold within which the analog value of the cell (or range value) resides. Several electronic circuits by which the aCAM cells 205 may be implemented will be discussed further below.

As discussed above, the present disclosure may encode more than three levels in a content addressable memory. In a memristor CAM, the information is ultimately mapped to resistance levels and there are $2^n+1$ distinct resistance levels between $R_{low}$ and $R_{high}$. That is, $R_{range}=R_{high}-R_{low}$ and includes $2^n+1$ distinct resistance levels, each distinct resistance level representing a different value. For example, where $R_{high} \neq R_{low}$ and $R_{high} > R_{low}$, then the aCAM cell 205 stores all levels between $R_{low}$ and $R_{high}$. For another example, if $R_{high}=R_{max}$ and $R_{low}=R_{min}$, then the aCAM cell 205 stores an X=do not care value. For yet another example, if $R_{high}$=a resistance $R_1$ and $R_{low}=R_1$−delta where delta= $(R_{max}-R_{min})/(2^n)$, then the aCAM cell 205 stores the single level $R_1$.

FIG. 4 depicts an electronic circuit implementing an aCAM cell 400 that may be used to implement the aCAM cells 205 of FIG. 2 in some examples. The aCAM cell 400 includes a "high side" 403 and a "low side" 406, so-called because the memristor M1 and the memristor M2 are programmed to determine the values of $R_{high}$ and $R_{low}$, respectively.

The high side 403 includes a first transistor T1 and a first memristor M1. The first memristor M1, in conjunction with the first transistor T1, defines a first voltage divider 409 for the voltage applied on $SL_P$ and, when programmed, the memristor M1 defines a high value $R_{high}$ of a range of values $R_{range}$. The high side 403 also includes a second transistor that, in use, indicates whether a searched value matches the high value $R_{high}$ as discussed further below. The low side 406 includes a third transistor T3 and the second memristor M2. The second memristor M2, in conjunction with the third transistor T3, defines a second voltage divider 412. When the second memristor M2 is programmed, the memristor M2 defines the low value $R_{low}$ of the range of values $R_{range}$. The low side 406 also includes a fourth transistor T4 that, in use, indicates whether the searched value matches the low value $R_{low}$.

The aCAM cell 400 also includes a match line ML, a word line WL that serves as a ground, search lines $SL_P$, $SL_N$, and data lines $DL_P$, $DL_N$. As noted above, the memristor-transistor pairs M1/T1 and M2/T3 define a respective voltage divider 409, 412. The memristors M1, M2 of the voltage dividers 409, 412 are used encode $R_{high}$ and $R_{low}$ when the memristors M1, M2 are programmed. (Whether the searched data matches the stored data is a function of the voltage divider (the M1/M2 values and the transistor characteristics)). Thus, in this example, in each memristor-transistor pair M1/T1 and M2/T3, the analog search is implemented as the gate voltage of the transistor to create a variable-resistor divider with the memristors programmed to analog (stored) values to represent an analog number or range.

In the high side 403, where $R_{high}$ is programmed, $V_{search}$ on $DL_P$ should be low enough such that the voltage at G1 (created by the voltage divider between T1 and M1) does not turn on the T2 pulldown transistor. If $DL_P$ is too low (indicating a search value above the $R_{high}$ bound), then T1 is very low resistance, and thus the voltage at G1 will be similar to the search voltage on $SL_P$, and therefore quite high causing T2 to turn on and discharge the pre-charged voltage on the ML, indicating a mismatch. In the low side 406, where $R_{low}$ is programmed, $V_{search}$ on $DL_N$ should be high enough such that the voltage at G2 (created by the voltage divider between M2 and T3) is fairly low and does not turn on the pulldown transistor T4. If $DL_N$ is too low, then T3 can be too high resistance, and cause the voltage at $G2 \sim SL_n$ search voltage, causing a mismatch and discharge similar to as noted above. This example uses an inverse mapping of the desired analog search value onto low and high gate voltages for T1 and T3 lines. So, for instance: $SL_P$=$SL_N$=0.8V, $DL_P$=0V, $DL_N$=1.5V, M1=10Ω, and M2=10 kΩ.

Note that the transistors T1-T4 are implemented using metal-oxide semiconductor field-effect transistors ("MOSFETs"). T1 is a positive or "p" MOSFET and T3 is a negative or "n" MOSFET. This permits the two memristors M1, M2 to be more similar in resistance. This, in turn, offers potential for more analog levels relative to examples in which T1 and T3 are both "n" MOSFETs with the memristor/transistors pairs reversed. These and other advantages arising from the circuit design will become apparent to those skilled in the art having the benefit of this disclosure.

The example aCAM cell 400 in FIG. 4 offers many "tuning knobs" for adjusting cell performance: the voltages on $DL_P$, $DL_N$, $SL_P$, $SL_N$, and the number of levels/ranges of M1 and M2, for instance. The source as GND for T1 and T2 pulldown transistors can also be changed to a global nonzero voltage value to help tune cases of near-matches. Still other tuning knobs, or sources for adjustment, may become apparent to those skilled in the art having the benefit of this disclosure.

Figure 5:
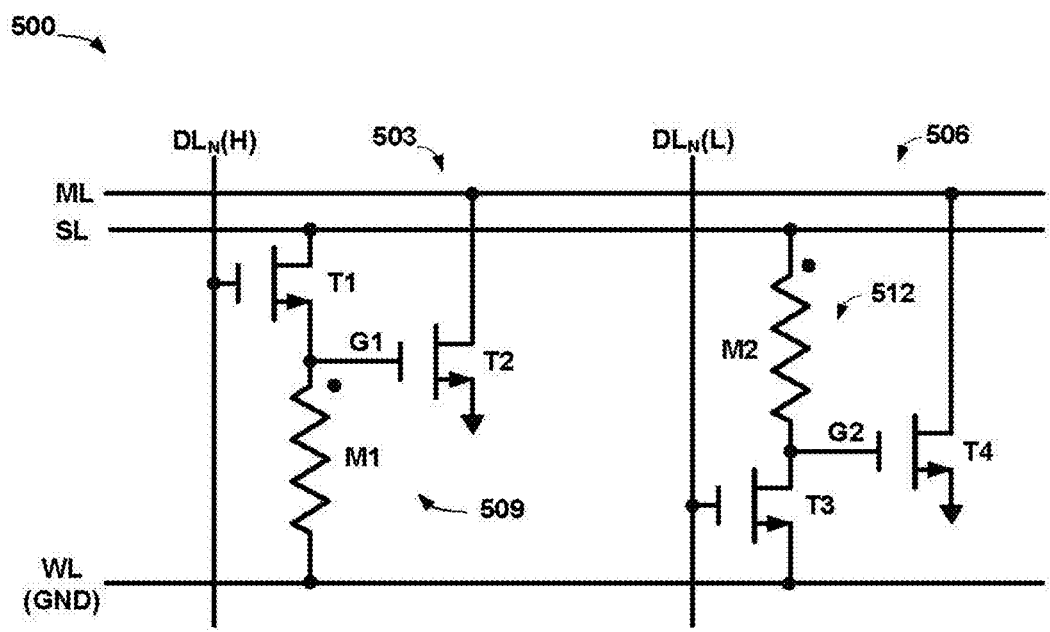
FIG. 5 depicts an analog CAM cell circuit that may be used to implement the analog CAM cells of FIG. 2 in some examples.

FIG. 5 depicts an electronic circuit implementing an aCAM cell 500 that may be used to implement the aCAM cells 205 of FIG. 2 in some examples. The aCAM cell 500 includes a "high side" 503 and a "low side" 506, so-called because the memristor M1 and the memristor M2 are programmed to determine the values of $R_{high}$ and $R_{low}$, respectively. The high side 503 includes a first transistor T1 and a first memristor M1. The first memristor M1, in conjunction with the first transistor T1, defines a first voltage divider 509 and, when M1 programmed accordingly, defines a high value $R_{high}$ of a range of values $R_{range}$. The high side 503 also includes a second transistor that, in use, indicates whether a searched value matches the high value $R_{high}$ as discussed further below. The low side 506 includes a third transistor T3 and the second memristor M2. The second memristor M2, in conjunction with the third transistor T3, defines a second voltage divider 512. When the second memristor M2 is programmed, the memristor M2 defines the low value $R_{low}$ of the range of values $R_{range}$. The low side 506 also includes a fourth transistor T4 that, in use, indicates whether the searched value matches the low value $R_{low}$.

The aCAM cell 500 also includes a match line ML, a word line WL that serves as a ground, a search line SL, and data lines $DL_N$(H), $DL_N$(L). As noted above, the memrstor-transistor pairs M1/T1 and M2/T3 define a respective voltage divider 509, 512. The voltage dividers 509, 512 are used encode $R_{high}$ and $R_{low}$ when the memristors M1, M2 are programmed. Thus, in this example, in each memristor-transistor pair M1/T1 and M2/T3, the analog search is implemented by determining the gate voltage of the voltage-divider transistors to create a variable-resistor divider with the memristors programmed to an analog (stored) value.

In the high side 503, where $R_{high}$ is programmed into M1, $V_{search}$ on data line $DL_N$(H) is low enough such that the voltage at G1 (created by the voltage divider between T1 and M1) does not turn on the T2 pulldown transistor. If data line $DL_N$(H) is too high (indicating a search value above the $R_{high}$ bound), then T1 is very low resistance, and thus the voltage at G1 will be similar to the search voltage on search line SL, causing a mismatch and discharge through T2. In the low side 506, where $R_{low}$ is programmed, $V_{search}$ on data line $DL_N$(L) is high enough such that the voltage at G2 (created by the voltage divider between M2 and T3) does not turn on the T4 pulldown transistor. If data line $DL_N$(L) is too low, then T3 can be too high resistance, and cause the voltage at G2-search line SL search voltage, causing a mismatch and discharge through T4. The high side 503 and low side 506 may share search line SL but may have limited bit resolution with only 'one' knob on voltage divider (data lines $DL_N$(H) and $DL_N$(L)). One might also separate search line SL into two search lines to control drain voltage independently on the two search sides, i.e., the high side 503 and the low side 506.

Figure 6:
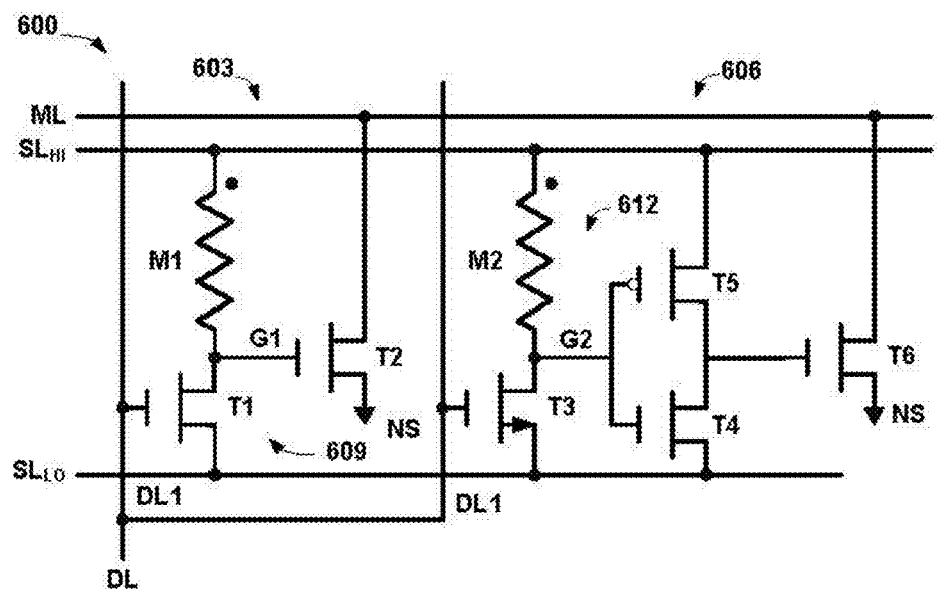
FIG. 6 depicts an analog CAM cell circuit that may be used to implement the analog CAM cells of FIG. 2 in some examples.

FIG. 6 depicts an electronic circuit implementing an aCAM cell 600 that may be used to implement the aCAM cells 205 of FIG. 2 in some examples. The aCAM cell 600 includes a "high side" 603 and a "low side" 606, so-called because the memristor M1 and the memristor M2 are programmed to determine the values of $R_{high}$ and $R_{low}$, respectively. The high side 603 includes a first transistor T1 and a first memristor M1. The first memristor M1, in conjunction with the first transistor T1, defines a first voltage divider 609 and, when programmed, defines a high value $R_{high}$ of a range of values $R_{range}$. The high side 603 also includes a second transistor that, in use, indicates whether a searched value matches the high value $R_{high}$ as discussed further below. The low sides 606 includes a third transistor T3 and the second memristor M2. The second memristor M2, in conjunction with the third transistor T3, defines a second voltage divider 612. When the second memristor M2 is programmed, the memristor M2 defines the low value $R_{low}$ of the range of values $R_{range}$. The low side 606 also includes another transistor T6 that, in use, indicates whether the searched value matches the low value $R_{low}$.

Note that the example shown in FIG. 4 and described above uses a different encoding of the input voltage for $DL_P$ and $DL_N$ than does the example of FIG. 6. In the example of FIG. 6, the inputs can be tied together, so that T1/M1 and T3/M2 are equivalent, but T4/T5 form an inverter. Thus, the left side and right side are defining the low and high side independently. Note that, although the T4/T5 inverter is in the low side 606 in the illustrated example, it may be implemented in the high side 603 in other examples.

The aCAM cell 600 also includes a match line ML, search lines $SL_{HI}$, $SL_{LO}$ and data lines DL, DL1. As noted above, the memristor-transistor pairs M1/T1 and M2/T3 define a respective voltage divider 609, 612. The voltage dividers 609, 612 are used to encode $R_{high}$ and $R_{low}$ when the memristors M1, M2 are programmed. Thus, in this example, in each memristor-transistor pair M1/T1 and M2/T3, the analog search is implemented as the gate voltage of the transistor to create a variable-resistor divider with the memristors programmed to an analog (stored) value.

More particularly, memristor M1 and transistor T1 form a voltage divider 609, in which M1 is a memristor with tunable non-volatile resistance and T1 is a transistor whose resistance increases with the input voltage on the data line DL. Therefore, there exists a threshold voltage, dependent on the M1 resistance, that when the data line DL input voltage is smaller than the threshold, the pull-down transistor T2 turns on which pulls down the match line ML yielding a 'mismatch' result. Similarity, memristor M2 and transistor T3 form another voltage divider 612, and the internal voltage node is inverted by the transistors T4, T5 before applying to another pull-down transistor T6. As a result, with properly programmed resistances in the memristors M1, M2, the aCAM cell 600 keeps the match line ML high only when the voltage on the data line DL is within a certain range defined by M1 and M2 resistances.

Figure 8:
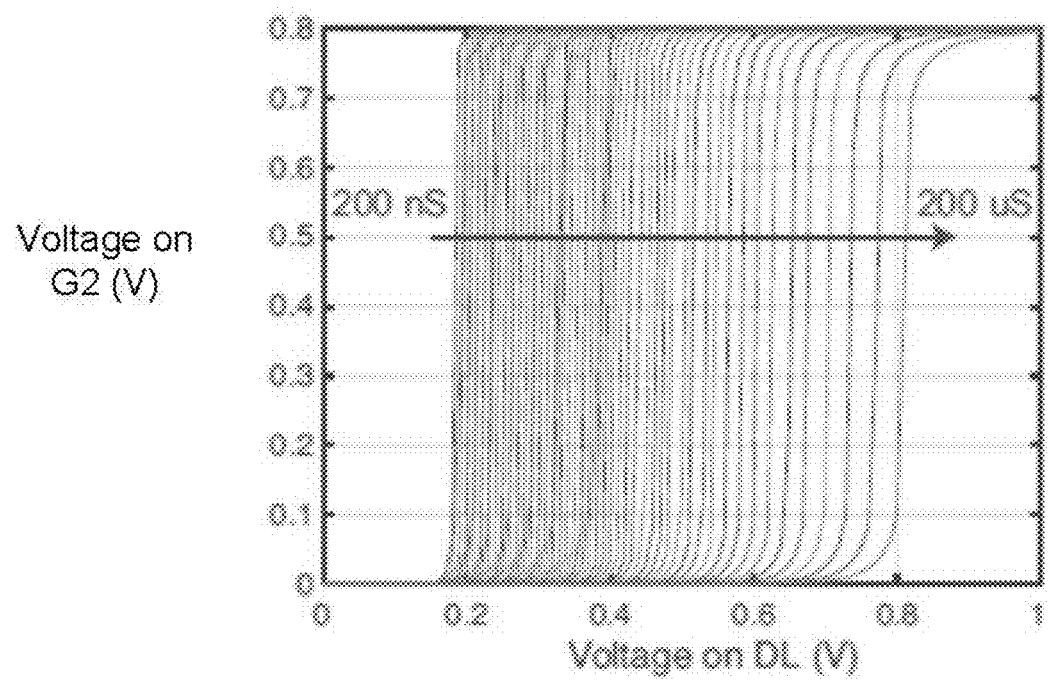
FIG. 8 is a graph plotting the relationship of the gate voltage G2 for the low side pull-down transistors of FIG. 6 (drain of T3) versus the data line voltage.
Figure 9:
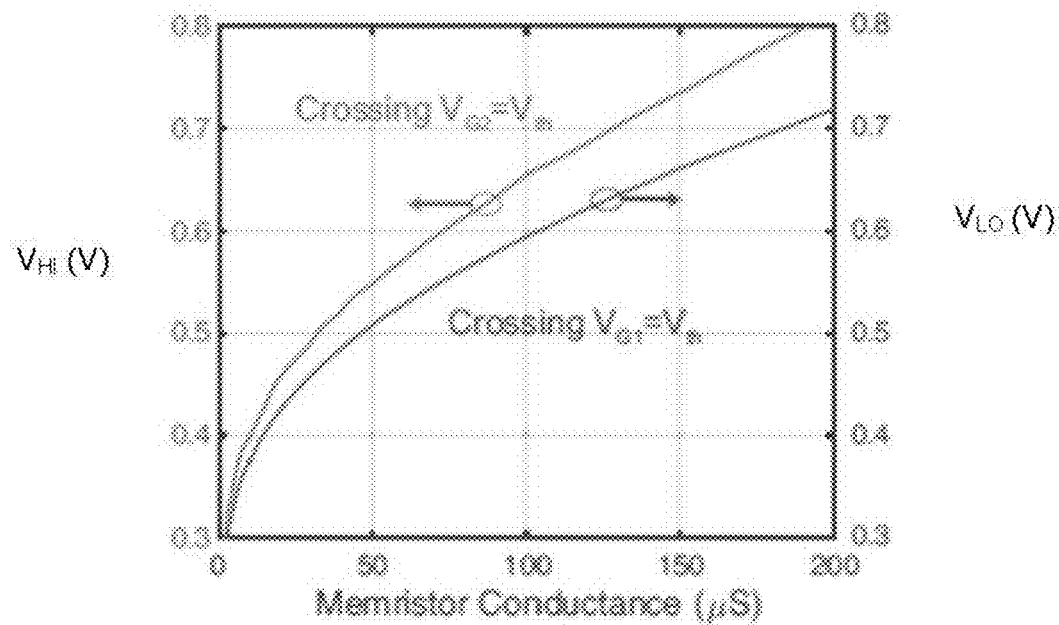
FIG. 9 is a graph plotting the cut-off data line voltage for a lower and an upper bound of a matched search versus memristor conductance in the analog CAM cell of FIG. 6.

Still referring to FIG. 6, the search result is therefore sensed as the voltage level on the ML, which is pulled down when the gate voltage of the pull-down transistor T1, T3 exceeds its threshold voltage ($V_{th}$). The gate voltages on the pull-down transistors T1, T3 with differently configured memristor conductances G1, G2 during the CAM search operation are plotted in FIG. 7 and FIG. 8. These graphs show that the voltage on G1 ($V_{G1}$) decreases with $V_{DL}$. Therefore, a lower bound voltage ($V_{lo}$) exists, which is configurable by the corresponding memristor conductance, that when the $V_{DL}$ is smaller than $V_{lo}$, $V_{G1}$ is larger than the $V_{th}$ of the pull-down transistor, causing the match line ML to be pulled down for a 'mismatch' result. Similarly, voltage on G2 ($V_{G2}$) increases with $V_{DL}$, and therefore the upper bound voltage is configured by another memristor conductance in the same aCAM cell 600. Combining the two parts, the search voltage upper and lower range (i.e. the search voltage range) is configured with the two memristor conductances in one aCAM cell, and the relationship between the search voltage range and the memristor conductance is plotted in FIG. 9, given that the threshold voltage of the simulated pull-down transistor is around 0.5 V in this example.

Figure 7:
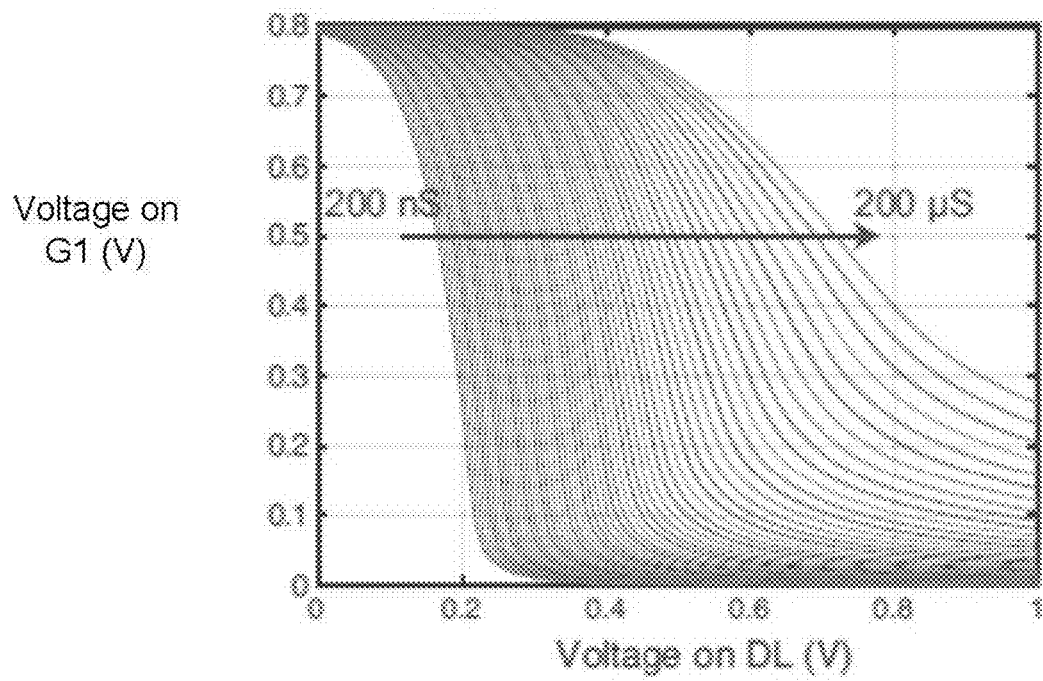
FIG. 7 is a graph plotting the relationship of the gate voltage G1 for the high side pull-down transistor T2 of FIG. 6 versus the data line voltage.
Figure 10:
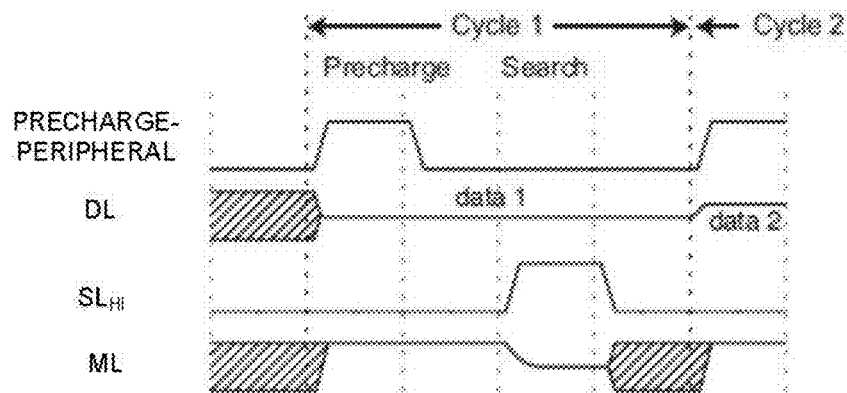
FIG. 10 is an example timing diagram for the operation of the analog CAM cell of FIG. 6.
Figure 11:
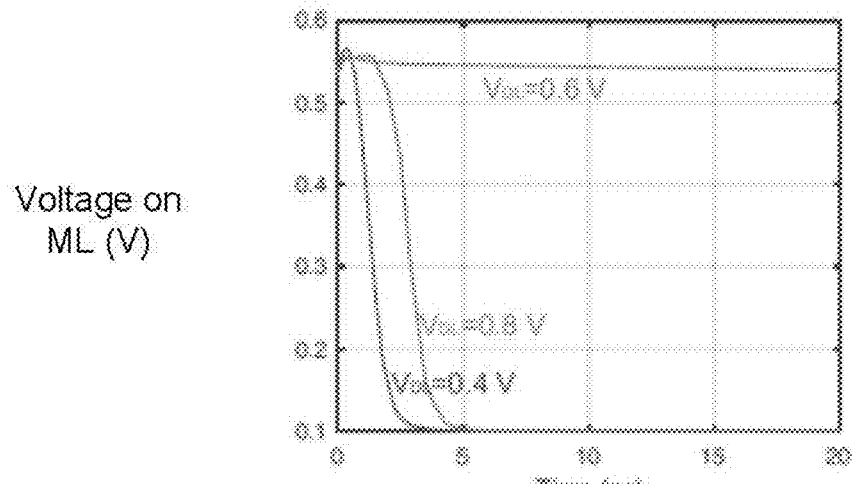
FIG. 11 is a graph plotting the transient voltage response of the match line over time during operation of the analog CAM cell of FIG. 6.
Figure 12:
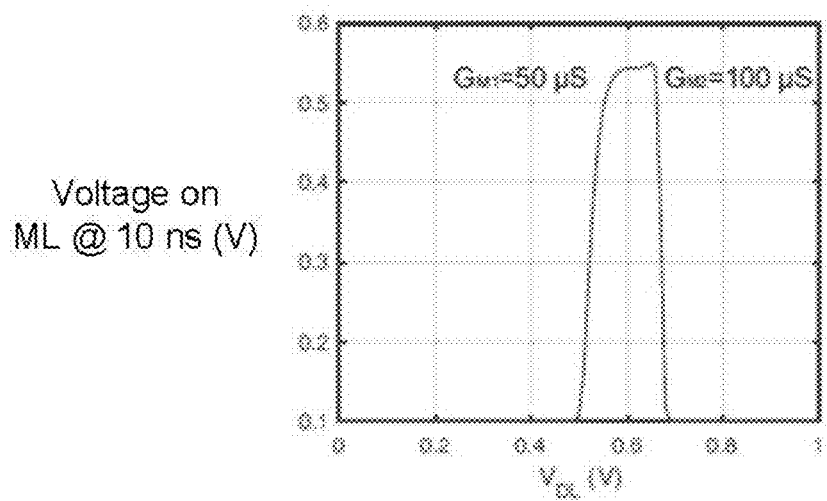
FIG. 12 is a graph of search result sensed on the match line of the analog CAM cell of FIG. 6 against the data line voltage given the M1 and M2 values shown on the plot.

The operation of the memristor aCAM cell 600 will now be discussed. FIG. 10 is an example timing diagram of the aCAM operations. The pre-charging of the match line ML is initiated by enabling a pre-charging peripheral not shown in FIG. 6. The data lines DL are asserted in conjunction with the match line ML pre-charge while $SL_{HI}$ is kept low. The search is started by asserting $SL_{HI}$. A transient voltage response on the ML with a search range defined in the memristors is shown in FIG. 11. Different curves show the search with different data line DL voltages. As shown in FIG. 12, the search result sensed from the match line ML 10 ns after initiating the search shows that the aCAM cell 600 outputs a match when the voltage on the data line DL falls within a predefined range defined by the memristor conductances given by G(M1) and G(M2) where conductance is the inverse of resistance. The gate voltage $V_{G1}$ at G1 in FIG. 6 of the pull-down transistor T2 drops to a voltage below its threshold with increasing data line DL voltage as shown in FIG. 7 and discussed above. The gate voltage $V_{G2}$ at G2 in FIG. 6 of the pull-down transistor T6 increases to a voltage above its threshold with increasing data line DL voltage. The cut-off data line DL voltage for a lower and upper bound of a matched search increases with the corresponding memristor conductance as shown in FIG. 9 and discussed above. Note that FIG. 7-FIG. 12 were obtained through simulated operations of the aCAM cell 600.

The relationship between the search voltage range and the memristor conductance can be better understood by the voltage divider effect from the series connected transistors and memristors M1/T1 and M2/T3 in FIG. 6. During the operation, the transistors T1, T2 are mostly working in a triode regime as the voltage drop across the transistor channel is fairly small. Under this condition, one derives that the match line is pulled down (i.e. a mismatch) only when the VDL follows the following equation:

$$V_{DL} \geq G_{M1} \cdot (V_{SLHI}/V_{TH,ML} - 1)/\beta + V_{TH}$$

where $V_{TH}$ and $V_{TH,ML}$ are the threshold voltages of the transistor in the voltage divider and the transistor which discharges or pulls down the ML respectively, and β is a constant coefficient. $G_{M1}$ is the memristor conductance, which is linearly correlated to the search voltage range on the DL according to the equation. The analysis is consistent with the results shown in FIG. 9, with an exception that when the memristor conductance is too small, where the voltage drop on the transistor channel is too small, more nonlinear effects are added to the relation.

Returning to FIG. 6, the aCAM cell 600 will output a match result when:

$$f(G_{M1}) < V_{DL} < f(G_{M2}),$$

where $f(G_{M1})$, and $f(G_{M2})$ are the voltages at G1, G2, respectively, in FIG. 6.

If a cell has DL as the input and G1 as output, it is an inverter with a tunable parameter defined by M1 resistance.

$$V_{G1} = \frac{R_{NFET}}{R_{NFET} + R_{M1}} \cdot V_{SLhi} < V_{g,pulldown}$$

Assuming NFET is working in a triode mode:

$$V_{DL} - V_{THN} > (V_{SLhi}/V_{th} - 1)/(\beta \cdot R_{M1}) \propto R_{M1}^{-1}$$

And, assuming NFET is working in a saturation mode:

$$V_{DL} - V_{THN} > \sqrt{2(V_{SLhi} - V_{th})/(\alpha\beta \cdot R_{M1})} \propto R_{M1}^{-0.5}$$

Turning now to FIG. 13, another example of an aCAM 1300 in accordance with some examples is shown. In the aCAM disclosed herein, search inputs are analog values instead of binarized '0's and '1's. Note that there is no register for the search data. Since the values are continuous, to avoid ambiguity, the stored value in the aCAM represents a range instead of a specific value. The search operation in the proposed aCAM is illustrated in FIG. 13. Similar to a digital CAM word, an aCAM word returns a 'match' result only when all input values fall within the ranges that are stored in analog memories, specifically for memristors, as resistance (or equivalently conductance) values for the word row of analog CAM cells. Noteworthy, the aCAM implements the TCAM-like function, where TCAM stores an equivalent 'range' from '0' to '1', while the aCAM stores arbitrary sections in whole range of the analog signal. The 'wild-card', or 'X' value, which matches all the inputs, can be stored when the resistances of the two memristor maps to the lower and upper bound of the input voltage range respectively.

Note that the analog search pattern is directly input to the aCAM 1300 over a plurality of inputs 1310. In some examples, the analog search pattern may be input over the inputs 1310 into a search register (not shown). Although search registers ordinarily are used with digital binary values as in the example of FIG. 1. However, search registers handling analog input values may be implemented using, for example, sample/hold circuits. Some examples (not shown) may therefore may input analog search values over one or more search registers.

Figure 14:
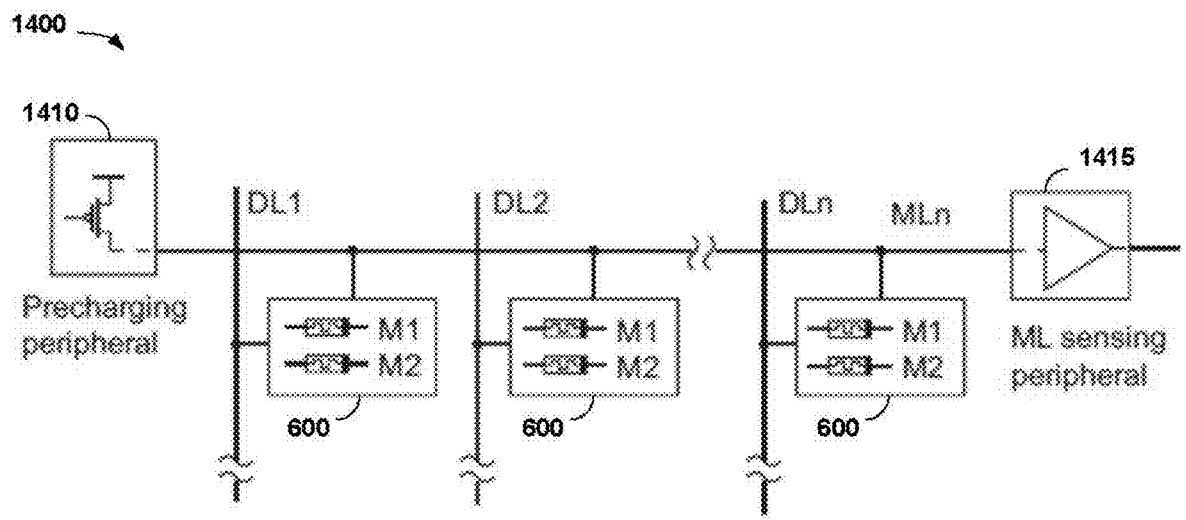
FIG. 14 illustrates a single row of analog CAM cells in the analog CAM of FIG. 13 in addition to a pre-charging peripheral and a sensing peripheral.
Figure 15:
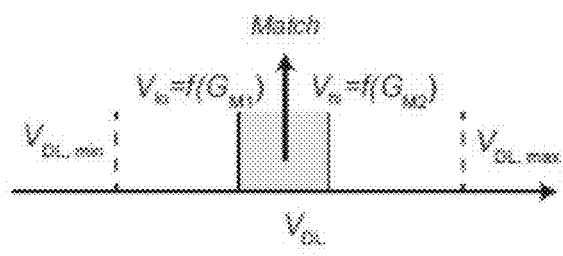
FIG. 15 graphically conceptually illustrates a resistance differential where the memristor conductances G(M1) and G(M2) encode the analog value stored in the cell and determine for what range of data line voltages results in a match (if the data line voltage falls within the gray portion).

FIG. 14 shows a high-level implementation 1400 of the memristor based aCAM 1300 of FIG. 13 in accordance with one or more examples. In the example illustrated in FIG. 14, the aCAM cells are implemented using the electronic circuit of FIG. 6—i.e., the aCAM cells 600 are arranged in rows and columns as described above although only a single row 1400 is shown in FIG. 14. The aCAM 1400 also includes data lines DL1-DLn and a match line ML for each row 1400. The aCAM 1400 includes a pre-charging peripheral 1410 that charges the match lines MLs in the enabled words to a high logic level prior to the search. A match line ML stays at the high logic level only when all the inputs are within the ranges defined by the memristor resistances in each CAM cells 600. The matching results are finally read out by a sensing peripheral 1415. FIG. 15 graphically illustrates a match.

Each of the examples disclosed above includes at least two programmed memristors. The memristors M1, M2 in the aCAM cells 400, 500, 600 are programmed before the search operation. Referring again to FIG. 6, the data lines DL1, DL2 select the memristor device, M1 or M2, to be programmed, and the programming voltage is applied through the search lines $SL_{HI}$ and $SL_{LO}$ to set (i.e., program the device from a low conductance state to a high conductance state) or reset the device. An analog voltage can be applied to the data lines DL1, DL2 to set a compliance current during the set operation for a better multilevel tunability. In the case that the programmed memristor conductance needs to be verified after the write operation, the conductance of a given memristor be read out by current while applying a reading voltage across $SL_{HI}$ and $SL_{LO}$, with data lines selects the device. TABLE 1 summarizes the detailed voltage signals as used in various operations.

TABLE 1

Write Operations of the Analog CAM Cell

| Operation | $SL_{HI}$ | $SL_{LO}$ | DL1 | DL2 |
|---|---|---|---|---|
| Set M1 | $V_{set}$ | 0 | $V_{g,set}$ | 0 |
| Reset M1 | 0 | $V_{reset}$ | $V_{DD}$ | 0 |
| Set M2 | $V_{set}$ | 0 | 0 | $V_{g,set}$ |
| Reset M2 | 0 | $V_{reset}$ | 0 | $V_{DD}$ |
| Read M1 | $V_{read}$ | 0 | $V_{DD}$ | 0 |
| Read M2 | $V_{read}$ | 0 | 0 | $V_{DD}$ |

The aCAM disclosed herein permits ternary-like operations. The aCAM cells store and operate on, as discussed above, a range of values. In a large fraction of TCAM encoding of desired data to be stored and matched, 'X's' are typically implemented from the right (less significant bits) to the left (more significant bits). The "don't cares" are not randomly distributed throughout an 8-bit/16-bit object. So, for instance, in a four-bit object Xs are almost always encoded as 1001, 100X, 10XX, 1XXX-1X1X typically is not implemented.

For instance, assume two-bit objects, which would use four levels of memristor resistance or conductance state—00, 01, 10, 11. Table 2 sets forth possible compressions using the aCAM cells of the present disclosure. Note that X1 and X0 are not eligible for compression in this technique.

TABLE 2

Compression with Two-Bit Objects

| Stored Value | Matches |
|---|---|
| 0X | 00, 01 |
| 1X | 10, 11 |
| XX | 00, 01, 10, 11 |

One should ensure the data compression ratio is matched to stored data attributes. Thus, to compress in four-bit objects, one uses a four-level aCAM cell. One could also set the number of stored analog bits per cell based on compression requirements and spacing of "X" bits, or "don't cares". As the same circuit can be used to encode four levels, eight levels, etc., this could be done dynamically.

For another instance, assume four-bit objects, yielding sixteen levels of memristor state. Introducing "X" bits, or "don't cares" from the right-hand side, one can introduce three Xs for the three right-most bits. Table 3 sets forth possible compressions using the aCAM cells of the present disclosure. Note that X000 to X111 are not eligible for compression in this technique.

TABLE 3

Compression with Four-Bit Objects

| Stored Value | Matches |
|---|---|
| 000X | 0000, 0001 |
| 001X | 0010, 0011 |
| 010X | 0100, 0101 |
| 011X | 0110, 0111 |
| 100X | 1000, 1001 |
| 101X | 1010, 1011 |
| 110X | 1100, 1101 |
| 111X | 1110, 1111 |
| 00XX | 0000 to 0011 |
| 01XX | 0100 to 0111 |
| 10XX | 1000 to 1011 |
| 11XX | 1100 to 1111 |
| 0XXX | 0000 to 0111 |
| 1XXX | 1000 to 1111 |

As described above, when 'X's are implemented from less significant bits to more significant bits, the TCAM is matching a continuous input range. For example, 10XX represents a matching from 1000-1011 (or 8-11 in decimal number), which can be represented by one 4-bit equivalent analog CAM cell. On the other hand, the analog CAM also permits the search in an arbitrary range in the 4-binary-bit space, and some of the ranges cannot be represented by one TCAM word. (e.g. 0010-1110 (or 2-14 in decimal number).

Note that the discussion associated with Table 2 and Table 3 discusses the functionality of the aCAM in terms of binary values. This is to establish that the aCAM disclosed herein can perform in the manner of known, digital TCAMs. However, as should be apparent from the disclosure herein, the aCAM can also store and operate on analog values with which compression would operate in an analogous manner to that discussed relative to Table 2 and Table 3.

Each of the examples of an aCAM memory cell in FIG. 4-FIG. 6 includes a high side and a low side in which the high bound and the low bound, respectively, of the range of values is set. Each of the high sides and low sides includes a first voltage divider and a second voltage divider, respectively. In each of these voltage dividers, T1 and T3 are variable resistances and M1 and M2 are programmable resistances. The variable resistor (e.g., T1, T3) is controlled electronically through the search line or data line voltage. The claimed subject matter admits variation in how the variable resistance and the programmable resistance may be implemented.

For instance, the programmable resistor may be a metal oxide memristor device, as is the case in the illustrated examples. Other examples may instead use a phase-change memory ("PCM") device, a spin torque transfer ("STT") device, a ferroelectric random access memory ("FeRAM") device, or other resistive memory devices with a programmable resistance. The variable resistor in the illustrated examples is a complementary metal oxide semiconductor ("CMOS") transistor. Other examples may instead use a ferroelectric transistor or other three-terminal electronic non-linear device (i.e., device resistance changes with applied voltage).

Furthermore, the examples discussed above present only illustrative means by which the high bound and low bound for the range of values in an aCAM memory cell. Those in the art having the benefit of this disclosure may appreciate other means by which this setting of the bounds may be accomplished. Accordingly, the subject matter claimed below encompasses means substantially equivalent to those expressly disclosed herein that perform this function.

Throughout this disclosure, the term "match" is used to describe a context in which a stored content "matches" a search-for portion of an input pattern. What constitutes a "match" will be implementation specific. So, for instance, in an operation with a digital, binary input, a "match" will be where the stored content is the same as the search-for input portion or is a "don't care" bit. In an operation with an analog input, a "match" will be where the searched-for input is within the range of values defined by the "high" value and the "low value" as described above or where a "don't care" bit. In the disclosed examples, a match may be defined as the ML voltage maintaining its pre-charged (high value), as well as a pattern match between searched and stored data.

The aCAM disclosed herein can increase memory density significantly relative to SRAM CAMs, as one aCAM cell searches and stores multibit signals with only six transistors while a SRAM CAM cell searches single-bit signals with 16 transistors. Since the energy consumption in the search operation of a CAM is mostly charging the parasitic capacitors, the reduced chip area leads to a significant drop in energy cost for completing a certain task. The analog processing capability also opens up the possibility of directly handling analog signals acquired from Internet of Things, such as sensors. The output of the aCAM is digital, which can be processed directly in digital logic, removing the cost of the expensive analog-digital conversion entirely. Furthermore, the function of the aCAM is intrinsically different from the digital CAMs, which may enable new applications for fuzzy logic, analog computing, probabilistic computing, and more.

This concludes the detailed description. The particular examples disclosed above are illustrative only, as examples described herein may be modified and practiced in different but equivalent manners apparent to those skilled in the art having the benefit of the teachings herein. Furthermore, no limitations are intended to the details of construction or design herein shown, other than as described in the claims below. It is therefore evident that the particular examples disclosed above may be altered or modified and all such variations are considered within the scope and spirit of the appended claims.

Accordingly, the protection sought herein is as set forth in the claims below.

What is claimed is:

1. An analog content addressable memory cell, comprising:
   a high side encoding a high bound on a range of values, the high side including a first voltage divider comprised of a first programmable resistor and a first electronically controlled variable resistor; and
   a low side encoding a low bound on the range of values, the low side including a second voltage divider comprised of a second programmable resistor and a second electronically controlled variable resistor.

2. The analog content addressable memory cell of claim 1, wherein the first programmable resistor and the second programmable resistor each comprise a resistive random access memory device.

3. The analog content addressable memory cell of claim 1, wherein the first programmable resistor and the second programmable resistor each comprise at least one of a metal oxide memristor device, a phase-change memory device, a spin torque transfer device, and a ferroelectric random access memory device.

4. The analog content addressable memory cell of claim 3, wherein the first variable resistor and the second variable resistor each comprise at least one of a complementary metal oxide semiconductor transistor, a ferroelectric transistor, and three-terminal electronic non-linear device.

5. The analog content addressable memory cell of claim 1, wherein the first variable resistor and the second variable resistor each comprise at least one of a complementary metal oxide semiconductor transistor, a ferroelectric transistor, and three-terminal electronic non-linear device.

6. The analog content addressable memory cell of claim 1, wherein at least one of the low side and the high side includes an inverter.

7. An analog content addressable memory, comprising:
   a plurality of inputs by which an input pattern may be loaded in use; and
   an analog memory cell array, each cell of the analog memory cell array indicating whether a value of the analog input pattern is matched by a range of values contained in the cell, the range of values including non-binary values,
   wherein each cell of the analog memory cell array comprises:
      a high side encoding a high bound on a range of values, the high side including a first voltage divider comprised of a first programmable resistor and a first electronically controlled variable resistor; and
      a low side encoding a low bound on the range of values, the low side including a second voltage divider comprised of a second programmable resistor and a second electronically controlled variable resistor.

8. The analog content addressable memory of claim 7, further comprising at least one of:
   a search data register into which a digital input pattern may be loaded in use via the inputs; and
   an encoder that generates a match location for the analog input pattern within the analog memory cell array.

9. The analog content addressable memory of claim 7, wherein at least one of the low side and the high side includes an inverter.

10. The analog content addressable memory of claim 7, further comprising at least one of:
    a pre-charging peripheral that, in use, pre-charges the cells of the analog memory cell array; and
    a sensing peripheral that senses indications of a match from the analog memory cell array.

11. A method for storing data in a content addressable memory, comprising:
    indicating whether a searched value in an input pattern matches a high value defining a range of values in a cell of an analog memory cell array of the content addressable memory, the range of values including non-binary values, wherein the searched value is a digital value; and
    indicating whether the searched value matches a low value defining the range of values in the cell.

12. The method of claim 11, wherein the method further comprising loading the searched value into a search register.

13. The method of claim 11, wherein the searched value is an analog value.

14. The method of claim 11, wherein the searched value is a "don't care" value.

15. The method of claim 11, further comprising encoding the indications, along with match indications for other searched values, into a representation of the matching locations.

16. The method of claim 11, further comprising programming the high value and the low value.

17. An analog content addressable memory cell, comprising:
   means for defining a high value of a range of values, the range of values including non-binary values and indicating whether a searched value matches the high value, including:
      a high side encoding a high bound on the range of values, the high side including a voltage divider formed by a programmable resistor and an electronically controlled variable resistor; and
   means for defining a low value of the range of values and indicating whether the searched value matches the low value.

18. The analog content addressable memory cell of claim 17, wherein the first programmable resistor and the second programmable resistor each comprise a resistive random access memory device.

19. The analog content addressable memory cell of claim 17, wherein the programmable resistor comprises at least one of a metal oxide memristor device, a phase-change memory device, a spin torque transfer device, and a ferroelectric random access memory device.

20. The analog content addressable memory cell of claim 17, wherein the variable resistor each comprise at least one of a complementary metal oxide semiconductor transistor, a ferroelectric transistor, and three-terminal electronic non-linear device.

21. The analog content addressable memory cell of claim 17, wherein the means for defining the low value includes:
   a low side encoding a low bound on the range of values, the low side including a voltage divider formed by a programmable resistor and a second electronically controlled variable resistor.

22. The analog content addressable memory cell of claim 21, wherein the programmable resistor comprises at least one of a metal oxide memristor device, a phase-change memory device, a spin torque transfer device, and a ferroelectric random access memory device.

23. The analog content addressable memory cell of claim 21, wherein the variable resistor each comprise at least one of a complementary metal oxide semiconductor transistor, a ferroelectric transistor, and three-terminal electronic non-linear device.

* * * * *